(12) United States Patent
Chen et al.

(10) Patent No.: US 12,268,050 B2
(45) Date of Patent: Apr. 1, 2025

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Zesheng Chen, Wuhan (CN); Yong Zhao, Wuhan (CN); Wenxu Xianyu, Wuhan (CN)

(*) Notice: Subject to any disclaimer, the term of this patent is extended or adjusted under 35 U.S.C. 154(b) by 899 days.

(21) Appl. No.: 17/052,825

(22) PCT Filed: Jul. 20, 2020

(86) PCT No.: PCT/CN2020/103041
§ 371 (c)(1),
(2) Date: Nov. 4, 2020

(87) PCT Pub. No.: WO2021/258456
PCT Pub. Date: Dec. 30, 2021

(65) Prior Publication Data
US 2023/0099301 A1 Mar. 30, 2023

(30) Foreign Application Priority Data

Jun. 22, 2020 (CN) .......................... 202010574123.1

(51) Int. Cl.
*H10K 50/86* (2023.01)
*H10K 59/38* (2023.01)
*H10K 59/12* (2023.01)

(52) U.S. Cl.
CPC .......... *H10K 50/865* (2023.02); *H10K 59/38* (2023.02); *H10K 59/12* (2023.02)

(58) Field of Classification Search
CPC ........ H10K 50/80; H10K 50/85; H10K 50/88; H10K 50/854; H10K 50/856; H10K 59/877; H10K 59/878; H10K 77/00
See application file for complete search history.

(56) References Cited

U.S. PATENT DOCUMENTS

| | | | |
|---|---|---|---|
| 2009/0021157 A1* | 1/2009 | Kim ..................... | H10K 50/865 445/24 |
| 2011/0234088 A1* | 9/2011 | Abe ..................... | H10K 59/877 428/218 |

(Continued)

FOREIGN PATENT DOCUMENTS

| CN | 101197390 A | 6/2008 |
|---|---|---|
| CN | 101483187 A | 7/2009 |

(Continued)

OTHER PUBLICATIONS

International Search Report in International application No. PCT/CN2020/103041, mailed on Mar. 12, 2021.

(Continued)

*Primary Examiner* — Jaehwan Oh

(57) ABSTRACT

A display panel is provided. The display panel includes a thin film transistor array layer, a light-emitting device layer, and a light shielding layer disposed on a substrate in sequence. The light shielding layer is provided with openings corresponding to positions of light-emitting areas of the light-emitting device layer, an organic protective layer is disposed on the light shielding layer, and the openings of the light shielding layer are filled with the organic protective layer having a transparent material. The present disclosure, by removing conventional red, green, and blue color resists which cover the light-emitting areas of the display panel, solves a problem of reduced yield of a color filter functional layer in a plurality of wet etching processes.

18 Claims, 3 Drawing Sheets

(56) References Cited

U.S. PATENT DOCUMENTS

| | | | |
|---|---|---|---|
| 2013/0240852 A1 | 9/2013 | Yamazaki | |
| 2014/0167085 A1* | 6/2014 | Lee | H10K 50/854 257/98 |
| 2016/0124557 A1* | 5/2016 | Choi | G06F 3/0412 345/173 |
| 2020/0089047 A1* | 3/2020 | Baek | G02F 1/133516 |
| 2022/0037411 A1* | 2/2022 | Zhang | B41M 7/0081 |

FOREIGN PATENT DOCUMENTS

| | | |
|---|---|---|
| CN | 101853877 A | 10/2010 |
| CN | 101483187 B | 6/2012 |
| CN | 103378312 A | 10/2013 |
| CN | 103700693 A | 4/2014 |
| CN | 108922984 A | 11/2018 |
| CN | 109686869 A | 4/2019 |
| CN | 110047889 A | 7/2019 |
| CN | 111129092 A | 5/2020 |
| CN | 111293149 A | 6/2020 |
| KR | 20190080312 A | 7/2019 |

OTHER PUBLICATIONS

Written Opinion of the International Search Authority in International application No. PCT/CN2020/103041, mailed on Mar. 12, 2021.

Chinese Office Action issued in corresponding Chinese Patent Application No. 202010574123.1 dated May 30, 2022, pp. 1-8.

* cited by examiner

DISPLAY PANEL

FIELD OF INVENTION

The present disclosure relates to the field of display technologies, and more particularly, to a display panel.

BACKGROUND OF INVENTION

Polarizers (POLs) can effectively reduce reflectivity of panels under strong light, while nearly 58% of light extraction efficiency is lost, which greatly increases a burden of service life for organic light-emitting diodes (OLEDs). In another aspect, the polarizers have a greater thickness and brittle material, thereby being unbeneficial for development of dynamic bending products. Using color filters to replace the polarizers (POLs) is categorized as a POL-less technique. A basic structure of the color filters includes red (R) color resists, green (G) color resists, blue (B) color resists, and a black matrix (BM). Based on characteristics of OLEDs' self-illumination, the color resists are required to respectively correspond to red, green, and blue sub-pixel units of the OLEDs to form a color filter functional layer. However, the color filter functional layer needs to undergo a plurality of photolithography processes, and a problem of reduced yield of the color filter functional layer will occur in a plurality of wet etching processes.

Therefore, there are defects in current technology and there is an urgent need to solve these defects.

Technical problem: the present disclosure provides a display panel, which can solve the problem of reduced yield of the color filter functional layer that occurs in the plurality of wet etching processes.

SUMMARY OF INVENTION

To solve the above problems, an embodiment of the present disclosure provides technical solutions as follows.

An embodiment of the present disclosure provides a display panel which includes:
  a substrate;
  a thin film transistor array layer disposed on the substrate;
  a light-emitting device layer disposed on the thin film transistor array layer;
  a light shielding layer disposed on the light-emitting device layer and provided with openings corresponding to positions of light-emitting areas of the light-emitting device layer; and
  an organic protective layer disposed on the light shielding layer;
  wherein the openings of the light shielding layer are filled with the organic protective layer, and the organic protective layer is a transparent material.

In the display panel of the present disclosure, the light-emitting device layer includes light-emitting devices arranged at intervals, each of the light-emitting devices includes an anode, a light-emitting layer, and a cathode disposed in a stack, a thin film encapsulation layer is disposed between the light-emitting device layer and the light shielding layer, and the thin film encapsulation layer includes an inorganic layer and an organic layer disposed in a stack.

In the display panel of the present disclosure, a light-absorbing medium layer is disposed on one side of the cathode adjacent to and/or away from the light-emitting layer, and a light-absorbing range of the light-absorbing medium layer ranges from 300 nm to 800 nm.

In the display panel of the present disclosure, the light-absorbing medium layer is disposed on the thin film encapsulation layer and corresponds to the openings of the light shielding layer.

In the display panel of the present disclosure, the light-absorbing medium layer includes a single layer or multilayers formed of at least one material of C60, boron subphthalocyanine chloride, or lead phthalocyanine.

In the display panel of the present disclosure, the light-absorbing medium layer includes a first light-absorbing medium layer, a second light-absorbing medium layer, and a third light-absorbing medium layer, the first light-absorbing medium layer is disposed corresponding to a red light-emitting device to absorb visible light except red light, the second light-absorbing medium layer is disposed corresponding to a green light-emitting device to absorb the visible light except green light, and the third light-absorbing medium layer is disposed corresponding to a blue light-emitting device to absorb the visible light except blue light.

In the display panel of the present disclosure, the light-absorbing medium layer includes a first sublayer, a second sublayer, a third sublayer, and a fourth sublayer disposed in a stack, the first sublayer is configured to absorb stray light with wavelengths ranging from 300 nm to a wavelength of blue light, the second sublayer is configured to absorb stray light with wavelengths ranging from a wavelength of green light to the wavelength of blue light, the third sublayer is configured to absorb stray light with wavelengths ranging from a wavelength of red light to the wavelength of green light, and the fourth sublayer is configured to absorb stray light with wavelengths ranging from 800 nm to the wavelength of red light.

In the display panel of the present disclosure, at least a part of the cathode is an oxide material.

In the display panel of the present disclosure, a plurality of diffuse reflection structures are distributed uniformly on a surface of the cathode.

In the display panel of the present disclosure, the thin film encapsulation layer is provided with a plurality of diffuse reflection structures distributed uniformly corresponding to the openings of the light shielding layer.

To solve the above problems, an embodiment of the present disclosure further provides a display panel. The display panel includes:
  a substrate;
  a thin film transistor array layer disposed on the substrate;
  a light-emitting device layer disposed on the thin film transistor array layer;
  a light shielding layer disposed on the light-emitting device layer, wherein the light shielding layer is a black matrix and is provided with openings corresponding to positions of light-emitting areas of the light-emitting device layer; and
  an organic protective layer disposed on the light shielding layer;
  wherein the openings of the light shielding layer are filled with the organic protective layer, and the organic protective layer is a transparent material.

In the display panel of the present disclosure, the light-emitting device layer includes light-emitting devices arranged at intervals, each of the light-emitting devices includes an anode, a light-emitting layer, and a cathode disposed in a stack, a thin film encapsulation layer is disposed between the light-emitting device layer and the light shielding layer, and the thin film encapsulation layer includes an inorganic layer and an organic layer disposed in a stack.

In the display panel of the present disclosure, a light-absorbing medium layer is disposed on one side of the cathode adjacent to and/or away from the light-emitting layer, and a light-absorbing range of the light-absorbing medium layer ranges from 300 nm to 800 nm.

In the display panel of the present disclosure, the light-absorbing medium layer is disposed on the thin film encapsulation layer and corresponds to the openings of the light shielding layer.

In the display panel of the present disclosure, the light-absorbing medium layer includes a single layer or multilayers formed of at least one material of C60, boron subphthalocyanine chloride, or lead phthalocyanine.

In the display panel of the present disclosure, the light-absorbing medium layer includes a first light-absorbing medium layer, a second light-absorbing medium layer, and a third light-absorbing medium layer, the first light-absorbing medium layer is disposed corresponding to a red light-emitting device to absorb visible light except red light, the second light-absorbing medium layer is disposed corresponding to a green light-emitting device to absorb the visible light except green light, and the third light-absorbing medium layer is disposed corresponding to a blue light-emitting device to absorb the visible light except blue light.

In the display panel of the present disclosure, the light-absorbing medium layer includes a first sublayer, a second sublayer, a third sublayer, and a fourth sublayer disposed in a stack, the first sublayer is configured to absorb stray light with wavelengths ranging from 300 nm to a wavelength of blue light, the second sublayer is configured to absorb stray light with wavelengths ranging from a wavelength of green light to the wavelength of blue light, the third sublayer is configured to absorb stray light with wavelengths ranging from a wavelength of red light to the wavelength of green light, and the fourth sublayer is configured to absorb stray light with wavelengths ranging from 800 nm to the wavelength of red light.

Beneficial effect: beneficial effects of the present disclosure are that by removing conventional red, green, and blue color resists which cover light-emitting areas of a display panel, the display panel provided by the present disclosure improves an area ratio of the light shielding layer, thereby reducing a number of masks for the polarizer-less photolithography technique and solving a problem of reduced yield of a color filter functional layer in a plurality of wet etching processes. In addition, by providing a plurality of diffuse reflection structures on the cathode or the thin film encapsulation layer corresponding to the light-emitting areas, the present disclosure can reduce a problem of increased reflections due to OLEDs' self-illumination and ambient light.

DESCRIPTION OF DRAWINGS

The following detailed description of specific embodiments of the present disclosure will make the technical solutions and other beneficial effects of the present disclosure obvious with reference to the accompanying drawings.

DETAILED DESCRIPTION OF PREFERRED EMBODIMENTS

Figure 1:
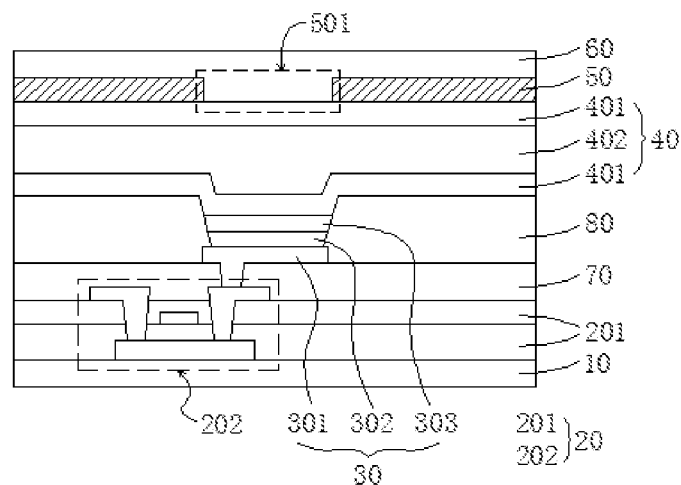
FIG. 1 is a schematic structural diagram of a display panel according to Embodiment 1 of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, it should be understood that terms such as "longitudinal", "lateral", "length", "width", "thickness", "upper", "lower", "front", "rear", "left", "right", "vertical", "horizontal", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified. In the present disclosure, the symbol "/" means "or".

The present disclosure may repeat reference numerals and/or reference letters in different examples, which are for the purpose of simplicity and clarity, and do not indicate the relationship between the various embodiments and/or arrangements discussed.

The display panel of the present disclosure will be described in detail below in conjunction with specific embodiments.

Embodiment 1

Referring to FIG. 1, a display panel of the present disclosure includes: a substrate 10, wherein the substrate 10 may be a glass substrate or a flexible substrate; a thin film transistor array layer 20 disposed on the substrate 10; a light-emitting device layer 30 disposed on the thin film transistor array layer 20; a thin film encapsulation layer 40 disposed on the light-emitting device layer 30; a light shielding layer 50 disposed on the thin film encapsulation layer 40 and provided with openings 501 corresponding to positions of light-emitting areas of the light-emitting device layer 30; and an organic protective layer 60 disposed on the light shielding layer 50, wherein the light shielding layer 50 may be planarized and has a certain hardness at a same time to protect the display panel. In addition, an anti-reflective coating layer (not shown in the figure) may also be disposed on the organic protective layer 60, which is not limited herein.

Wherein, the thin film transistor array layer 20 includes inorganic stacked layers 201 disposed in a stack and a thin film transistor 202 disposed in the inorganic stacked layers 201. The inorganic stacked layers 201 include, but are not limited to, a gate insulation layer and an interlayer insulation layer, and the thin film transistor 202 includes an active layer, a gate electrode, and source/drain electrodes.

Organic stacked layers such as a planarization layer 70 and a pixel definition layer 80 may also be disposed on the thin film transistor array layer 20, and the pixel definition layer 80 defines pixel areas, that is, the light-emitting areas, after patterning.

The light-emitting device layer 30 includes light-emitting devices arranged at intervals, each of the light-emitting devices includes an anode 301, a light-emitting layer 302, and a cathode 303 disposed in a stack, a thin film encapsulation layer 40 is disposed between the light-emitting device layer 30 and the light shielding layer 50, and the thin film encapsulation layer 40 includes inorganic layers 401 and an organic layer 402 disposed in a stack.

Further, the openings 501 of the light shielding layer 50 correspond to the positions of the light-emitting areas of the light-emitting device layer 30, and it can be understood that the openings 501 mean hollowed-out areas of the light shielding layer 50, that is, there is no light shielding layer 50 in the openings 501. The openings 501 of the light shielding layer 50 are filled with the organic protective layer 60, and the organic protective layer 60 is a transparent material.

Further, the light shielding layer 50 may be a black matrix and mainly has a strong absorption effect on incident full-band wavelengths, and in general, an optical density (OD) is required to be greater than 3, that is, a transmittance of a black matrix with a thickness of 1 um is less than 0.1%.

The present disclosure uses a light absorption effect of the light shielding layer 50, a main body of a polarizer-less structure thereof is the light shielding layer 50 having a high area ratio, and this structure removes conventional red, green, and blue color resists which cover OLED light-emitting areas. Compared to conventional color filter substrates which need to reserve preparation space for the color resists and process tolerance between the color resists and the black matrix, since only the light-emitting areas need to be reserved, an area ratio of the light shielding layer 50 of the present disclosure can be greatly improved and may be more than 90%, thereby greatly improving a light shielding effect of the light shielding layer 50 without affecting pixel aperture ratio and effectively preventing light leakage. Meanwhile, a number of masks manufacturing the red, green, and blue color resists in three processes and costs for three color resist materials can be saved.

Since conventional color filter substrates need to undergo wet etching of the red, green, and blue color resists, undesirable phenomena such as over-etching or incomplete etching usually exist in a plurality of etching processes, thereby reducing yield of the color filter substrates. The above solution of the present disclosure can effectively solve this technical problem.

In order to ensure that the entire display panel has a higher transmittance, under a situation of ensuring a service life of the OLED light-emitting devices, the pixel aperture ratio needs to be greater than 15% to 20%.

Embodiment 2

Figure 2:
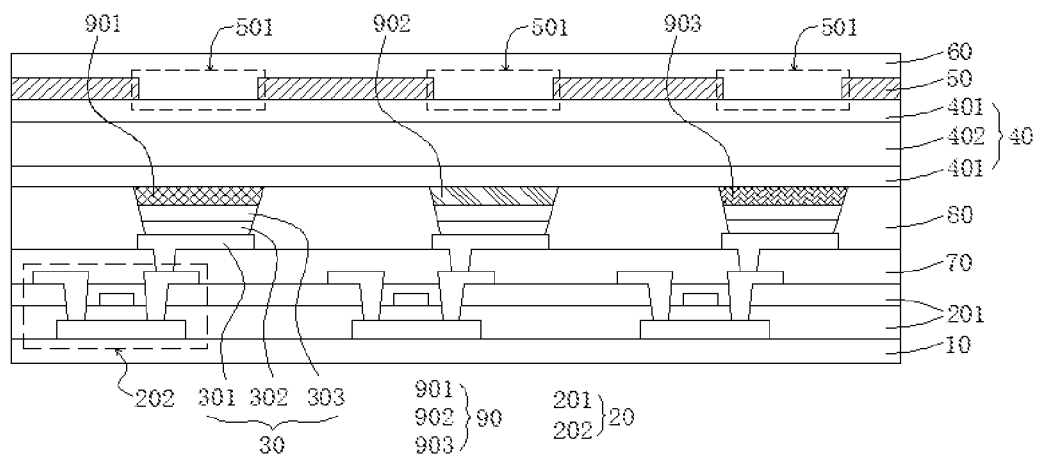
FIG. 2 is a schematic structural diagram of a first display panel according to Embodiment 2 of the present disclosure.
Figure 3:
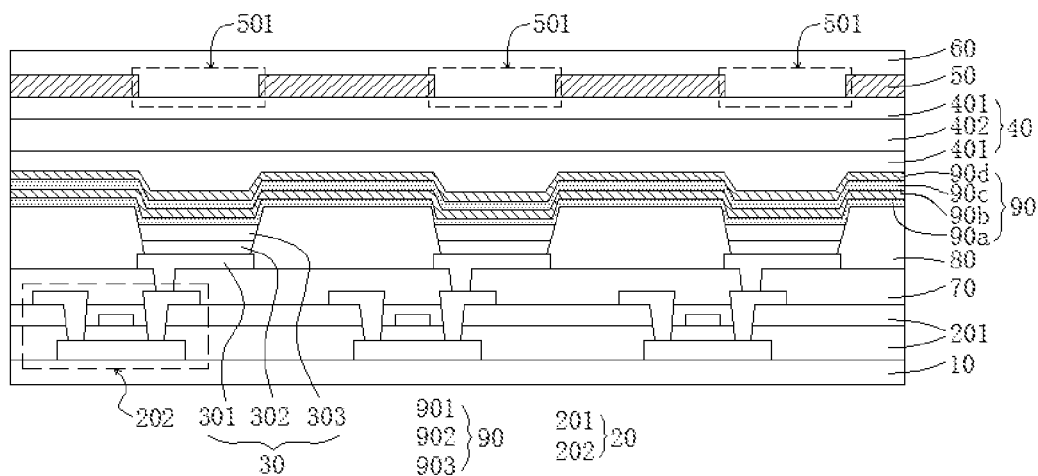
FIG. 3 is a schematic structural diagram of a second display panel according to Embodiment 2 of the present disclosure.

Referring to FIGS. 2 to 3, a display panel of this embodiment and the display panel of Embodiment 1 above have a same/similar structure, and a difference is only that in the display panel of this embodiment, a light-absorbing medium layer 90 is disposed on one side of the cathode 303 adjacent to and/or away from the light-emitting layer 302, and a light-absorbing range of the light-absorbing medium layer 90 ranges from 300 nm to 800 nm.

In general, metal device layers in an interior of the display panel, such as the cathode and the anode, have reflective function, and most external light entering the interior of the display panel or self-luminous light of OLEDs will be reflected from the metal device layers back to an external environment, thereby affecting display effect. Since the light-absorbing medium layer 90 has a certain light absorbing function, the present disclosure has a certain effect to reduce reflections of OLED devices, and a reflectivity of a part of pixel apertures can be reduced to less than 40%, thereby solving the problem of increased reflections due to OLEDs' self-illumination and ambient light.

Wherein, the light-absorbing medium layer 90 includes, but is not limited to, a single layer or multilayers formed of at least one material of C60, boron subphthalocyanine chloride (SubPc), or lead phthalocyanine (PbPc).

Referring to FIG. 2, which is a schematic structural diagram of a first display panel according to this embodiment, the light-absorbing medium layer 90 may be disposed on an upper surface or a lower surface of the cathode 303. Here, the light-absorbing medium layer 90 disposed on the upper surface of the cathode 303 is taken as an example for description. The light-absorbing medium layer 90 includes a first light-absorbing medium layer 901, a second light-absorbing medium layer 902, and a third light-absorbing medium layer 903. The first light-absorbing medium layer 901 is disposed corresponding to a red light-emitting device to absorb visible light except red light, the second light-absorbing medium layer 902 is disposed corresponding to a green light-emitting device to absorb the visible light except green light, and the third light-absorbing medium layer 903 is disposed corresponding to a blue light-emitting device to absorb the visible light except blue light. That is, the light-absorbing medium layer 90 of this embodiment has an effect equivalent to a selective absorption effect of the color resists on incident full-band wavelengths in conventional structures, and only light that matches OLED emission wavelengths can be transmitted. In this embodiment, with cooperation of the light shielding layer 50 and the light-absorbing medium layer 90, the display panel can maintain excellent contrast and color purity without the conventional color resists.

Based on Embodiment 1 above, this embodiment disposes the light-absorbing medium layer 90 on a surface of the cathode 303, which can absorb the most external light which enters the interior of the display panel through the openings 501 of the light shielding layer 50 and is emitted to the cathode 303, thereby reducing reflections of the display panel to the ambient light. In addition, the light-absorbing medium layer 90 corresponding to one of the light-emitting devices can absorb light emitted from adjacent light-emitting devices having different colors and reflected to the light-emitting device, which can reduce reflections of OLEDs' self-illumination to the display panel, thereby solving a color mixing problem between the light-emitting devices having different colors. Meanwhile, this embodiment will not affect light extraction efficiency of the light-emitting devices, which is beneficial for improving the contrast of the display panel, and the light extraction efficiency can be improved to above 70%.

Referring to FIG. 3, FIG. 3 is a schematic structural diagram of a second display panel according to this embodiment. Here, the light-absorbing medium layer 90 disposed on the upper surface of the cathode 303 is taken as an example for description. A difference of this display panel from the first display panel mentioned above is that the light-absorbing medium layer 90 includes a first sublayer 90a, a second sublayer 90b, a third sublayer 90c, and a fourth sublayer 90d disposed in a stack. The first sublayer 90a is configured to absorb stray light with wavelengths ranging from 300 nm to a wavelength of blue light, wherein under normal circumstances, the wavelength of blue light ranges from 400 nm to 450 nm; the second sublayer 90b is configured to absorb stray light with wavelengths ranging from a wavelength of green light to the wavelength of blue light, wherein under normal circumstances, the wavelength of green light ranges from 500 nm to 550 nm; the third sublayer 90c is configured to absorb stray light with wavelengths ranging from a wavelength of red light to the wavelength of green light, wherein under normal circumstances, the wavelength of red light ranges from 600 nm to 660 nm; and the fourth sublayer 90d is configured to absorb stray light with wavelengths ranging from 800 nm to the wavelength of red light.

Since the light-absorbing medium layer 90 is disposed on the surface of the cathode 303 in a whole surface, there is no need to use a mask in a manufacturing process of the light-absorbing medium layer 90. Since the stacked light-absorbing medium layer 90 only allows red light, green light, and blue light to be transmitted, most external light entering the display panel and emitted to the light-emitting areas and non-light-emitting areas will be absorbed, thereby reducing reflections of the display panel to the ambient light and improving the display effect. In another words, the light-absorbing medium layer 90 of this embodiment can absorb the stray light having the wavelengths ranging from the red light to the green light and ranging from the green light to the blue light, and can transmit light that matches OLED emission wavelengths at a same time, thereby further purifying light emitted by the light-emitting devices. Based on this, in this embodiment, with cooperation of the light shielding layer 50 and the light-absorbing medium layer 90, the display panel can maintain excellent contrast and color purity without the conventional color resists.

Embodiment 3

Figure 4:
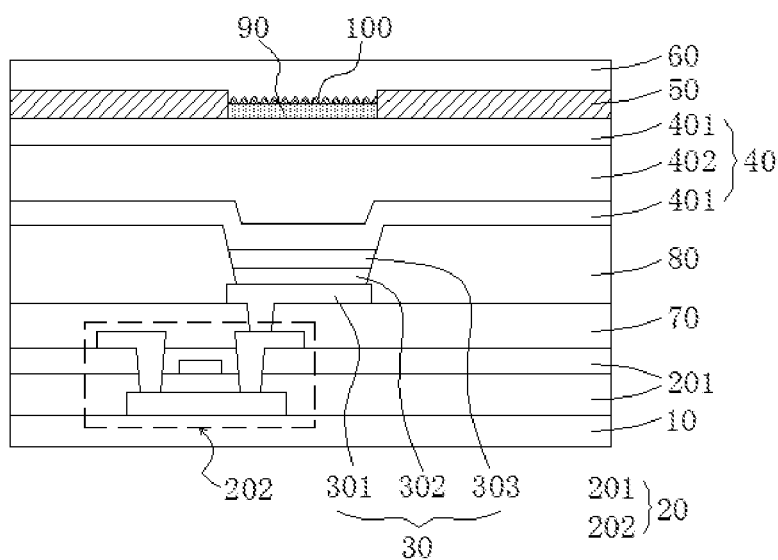
FIG. 4 is a schematic structural diagram of a display panel according to Embodiment 3 of the present disclosure.

Referring to FIG. 4, a display panel of this embodiment and the display panel of Embodiment 2 above have a same/similar structure, and a difference is only that in the display panel of this embodiment, the light-absorbing medium layer 90 is disposed on the thin film encapsulation layer 40 and corresponds to the openings 501 of the light shielding layer 50.

Specifically, the light-absorbing medium layer 90 may be disposed on any one of film layers of the inorganic layers 401 or the organic layer 402 in the thin film encapsulation layer 40. Beneficial effects produced by this embodiment are same as which in Embodiment 2 above, which will not be iterated herein for the sake of conciseness.

Further, a surface of the light-absorbing medium layer 90 is provided with a plurality of diffuse reflection structures 100, and the present disclosure does not limit shapes and sizes of the diffuse reflection structures 100. This design can reduce the external light entering the display panel, thereby further reducing the reflections of the display panel to the ambient light.

Embodiment 4

Referring to FIG. 1, a display panel of this embodiment and the display panel of Embodiment 1 above have a same/similar structure, and a difference is only that in the display panel of this embodiment, at least a part of the cathode 303 is an oxide material.

Specifically, after evaporating a light-emitting layer material in pixel apertures, a translucent cathode material (such as Mg/Ag) is evaporated, and plasma or micro-oxidation treatments in a vacuum chamber is performed after evaporating the cathode material, which oxidizes a part of the cathode material, thereby reducing strong reflections of a surface of the cathode and further reducing the reflections of the display panel to OLEDs' self-illumination and the ambient light.

Embodiment 5

Referring to FIGS. 2 to 4, a display panel of this embodiment and the display panel of Embodiments 2 or 3 above have a same/similar structure, and a difference is only that in the display panel of this embodiment, at least a part of the cathode 303 is an oxide material.

For a method of performing an oxidation treatment on the cathode 303 in this embodiment, please refer to the description in Embodiment 4 above, which will not be iterated herein for the sake of conciseness.

Based on the beneficial effects produced by Embodiments 2 or 3, since a part of the cathode material is oxidized, strong reflections of a surface of the cathode can be reduced, thereby further reducing the reflections of the display panel to OLEDs' self-illumination and the ambient light.

Embodiment 6

Figure 5:
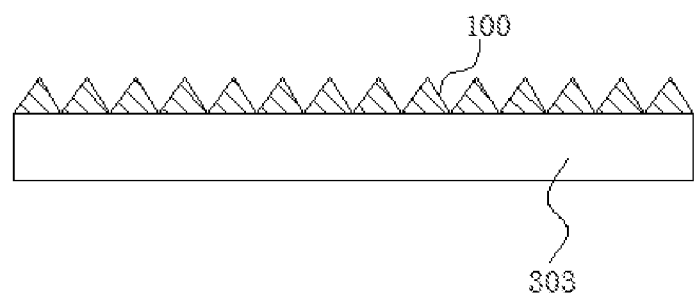
FIG. 5 is a schematic structural diagram of a cathode with a plurality of diffuse reflection structures.

Referring to FIGS. 1 and 5, FIG. 5 is a schematic structural diagram of a cathode with a plurality of diffuse reflection structures. A display panel of this embodiment and the display panel of Embodiment 1 above have a same/similar structure, and a difference is only that in the display panel of this embodiment, diffuse reflection structures 100 are distributed uniformly on a surface of the cathode 303.

This embodiment is based on Embodiment 1 above, since a surface (an upper surface or a lower surface) of the cathode 303 has the diffuse reflection structures 100, a certain scattering treatment can be performed on external ambient light emitted to the cathode 303, thereby further preventing the external ambient light emitted into the interior of the display panel from being reflected back to the external environment by the cathode 303.

Embodiment 7

Referring to FIGS. 2 to 5, a display panel of this embodiment and the display panel of Embodiments 2 or 3 above have a same/similar structure, and a difference is only that in the display panel of this embodiment, a plurality of diffuse reflection structures 100 are distributed uniformly on a surface of the cathode 303.

This embodiment is based on Embodiments 2 or 3 above, since a surface of the cathode 303 has the diffuse reflection structures 100, a certain scattering treatment can be performed on external ambient light emitted to the cathode 303, thereby further preventing the external ambient light emitted into the interior of the display panel from being reflected back to the external environment by the cathode 303.

Embodiment 8

Figure 6:
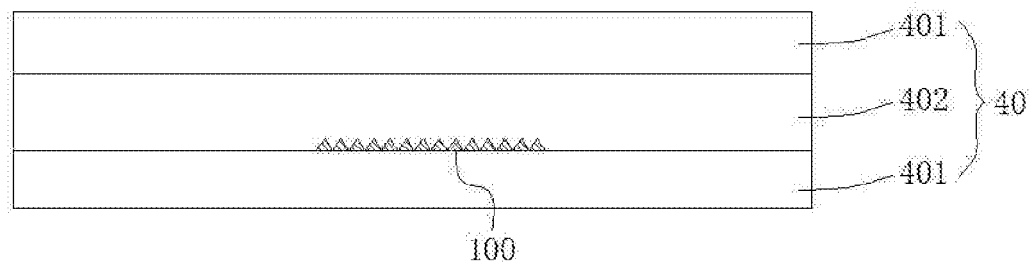
FIG. 6 is a schematic structural diagram of a thin film encapsulation layer with the plurality of diffuse reflection structures.

Referring to FIGS. 1 and 6, FIG. 6 is a schematic structural diagram of a thin film encapsulation layer with a plurality of diffuse reflection structures. A display panel of this embodiment and the display panel of Embodiment 1 above have a same/similar structure, and a difference is only that in the display panel of this embodiment, the thin film encapsulation layer 40 is provided with a plurality of diffuse reflection structures 100 distributed uniformly corresponding to the openings 501 of the light shielding layer 50.

Specifically, the diffuse reflection structures 100 may be disposed on any one of film layers of the inorganic layers 401 or the organic layer 402 in the thin film encapsulation layer 40.

This embodiment is based on Embodiment 1 above, since a surface of the thin film encapsulation layer 40 has the diffuse reflection structures 100, a certain scattering treatment can be performed on external ambient light emitted into the display panel, thereby further reducing a luminous flux emitted into the display panel.

Embodiment 9

Referring to FIGS. 2 to 4, and 6, a display panel of this embodiment and the display panel of Embodiments 2 or 3 above have a same/similar structure, and a difference is only that in the display panel of this embodiment, the thin film encapsulation layer 40 is provided with a plurality of diffuse reflection structures 100 distributed uniformly corresponding to the openings 501 of the light shielding layer 50.

This embodiment is based on Embodiments 2 or 3 above, since a surface of the thin film encapsulation layer 40 has the diffuse reflection structures 100, a certain scattering treatment can be performed on external ambient light emitted into the display panel, thereby further reducing a luminous flux emitted into the display panel.

By removing conventional red, green, and blue color resists which cover the light-emitting areas of the display panel, the present disclosure improves an area ratio of the light shielding layer, thereby reducing the number of masks for the polarizer-less photolithography technique and solving the problem of reduced yield of the color filter functional layer in a plurality of wet etching processes. In addition, by providing a plurality of diffuse reflection structures on the cathode or the thin film encapsulation layer corresponding to the light-emitting areas, the present disclosure can reduce the problem of increased reflections due to OLEDs' self-illumination and ambient light.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising:
   a substrate;
   a thin film transistor array layer, disposed on the substrate;
   a light-emitting device layer, disposed on the thin film transistor array layer and comprises light-emitting devices arranged at intervals, wherein each of the light-emitting devices comprises an anode, a light-emitting layer, and a cathode disposed in a stack;
   a light-absorbing medium layer, disposed on a side of the cathode adjacent to and/or away from the light-emitting layer and comprising a first sublayer, a second sublayer, a third sublayer, and a fourth sublayer disposed in a stack;
   a light shielding layer, disposed on the light-emitting device layer and provided with openings corresponding to positions of light-emitting areas of the light-emitting devices;
   an organic protective layer disposed on the light shielding layer; and
   a plurality of diffuse reflection structures, disposed on a light emitting side of the light-emitting devices and at least corresponding to the openings of the light shielding layer to perform a scattering treatment on ambient light,
   wherein the plurality of diffuse reflection structures are distributed uniformly directly on a surface of the cathode;
   the openings of the light shielding layer are filled with the organic protective layer, and the organic protective layer is a transparent material; and
   the first sublayer is configured to absorb stray light with wavelengths ranging from 300 nm to a wavelength of blue light, the second sublayer is configured to absorb stray light with wavelengths ranging from a wavelength of green light to the wavelength of blue light, the third sublayer is configured to absorb stray light with wavelengths ranging from a wavelength of red light to the wavelength of green light, and the fourth sublayer is configured to absorb stray light with wavelengths ranging from 800 nm to the wavelength of red light.

2. The display panel according to claim 1, wherein a thin film encapsulation layer is disposed between the light-emitting device layer and the light shielding layer, and the thin film encapsulation layer comprises an inorganic layer and an organic layer disposed in a stack.

3. The display panel according to claim 2, wherein the light-absorbing medium layer is disposed on the thin film encapsulation layer and corresponds to the openings of the light shielding layer.

4. The display panel according to claim 1, wherein the light-absorbing medium layer is made of at least one material of C60, boron subphthalocyanine chloride, or lead phthalocyanine.

5. The display panel according to claim 2, wherein at least a part of the cathode is an oxide material.

6. The display panel according to claim 1, wherein the light shielding layer is a black matrix.

7. A display panel, comprising:
   a substrate;
   a thin film transistor array layer, disposed on the substrate;
   a light-emitting device layer, disposed on a side of the thin film transistor array layer away from the substrate, and comprising a plurality of light-emitting areas arranged at intervals;
   a light-absorbing medium layer, disposed on a light-emitting side of the light-emitting device layer, and arranged at least corresponding to the plurality of light-emitting areas;
   a light shielding layer, disposed on a side of the light-absorbing medium layer away from the light-emitting device layer, and provided with openings respectively corresponding to positions the plurality of light-emitting areas;
   a thin film encapsulation layer, disposed between the light-emitting device layer and the light shielding layer;
   an organic protective layer, disposed on a side of the light shielding layer away from the substrate; and
   a plurality of diffuse reflection structures, disposed on a light emitting side of the light-emitting device layer and at least corresponding to the openings of the light shielding layer to perform a scattering treatment on ambient light, wherein the openings of the light shielding layer are filled with the organic protective layer, and the organic protective layer is a transparent material;

the light-absorbing medium layer is disposed on a side of the thin film encapsulation layer away from the light-emitting device layer and disposed in the openings of the light shielding layer; and the plurality of diffuse reflection structures are distributed uniformly and directly on a surface of the light-absorbing medium layer away from the the thin film encapsulation layer.

8. The display panel according to claim 7, wherein a light-absorbing range of the light-absorbing medium layer ranges from 300 nm to 800 nm.

9. The display panel according to claim 8, wherein the light-emitting device layer comprises red light-emitting devices, green light-emitting devices, and blue light-emitting devices arranged at intervals; and the light-absorbing medium layer comprises:

first light-absorbing medium portions, disposed corresponding to the red light-emitting devices, and configured to to absorb visible light except red light;

second light-absorbing medium portions, disposed corresponding to the green light-emitting devices, and configured to to absorb visible light except green light; and third light-absorbing medium portions, disposed corresponding to the blue light-emitting devices, and configured to to absorb visible light except blue light.

10. The display panel according to claim 8, wherein the light-absorbing medium layer comprises a first sublayer, a second sublayer, a third sublayer, and a fourth sublayer disposed in a stack, the first sublayer is configured to absorb stray light with wavelengths ranging from 300 nm to a wavelength of blue light, the second sublayer is configured to absorb stray light with wavelengths ranging from a wavelength of green light to the wavelength of blue light, the third sublayer is configured to absorb stray light with wavelengths ranging from a wavelength of red light to the wavelength of green light, and the fourth sublayer is configured to absorb stray light with wavelengths ranging from 800 nm to the wavelength of red light.

11. The display panel according to claim 10, wherein each of the first sublayer, the second sublayer, the third sublayer, and the fourth sublayer is arranged in a whole surface.

12. The display panel according to claim 8, wherein the light-emitting device layer comprises light-emitting devices arranged at intervals, each of the light-emitting devices comprises an anode, a light-emitting layer, and a cathode stacked in sequence away from the substrate, and the light-absorbing medium layer is disposed between the light-emitting layer and the cathode.

13. The display panel according to claim 1, wherein the plurality of diffuse reflection structures are distributed uniformly directly on a surface of the cathode.

14. The display panel according to claim 13, wherein the plurality of diffuse reflection structures are distributed uniformly directly on a surface of the cathode facing away from the light-emitting layer.

15. The display panel according to claim 8, wherein the light-emitting device layer comprises light-emitting devices arranged at intervals, each of the light-emitting devices comprises an anode, a light-emitting layer, and a cathode stacked in sequence away from the substrate, and the light-absorbing medium layer is disposed between the cathode and the thin film encapsulation layer.

16. A display panel, comprising:

a substrate;

a thin film transistor array layer, disposed on the substrate;

a light-emitting device layer, disposed on a side of the thin film transistor array layer away from the substrate, comprising a plurality of light-emitting areas arranged at intervals, and comprising light-emitting devices arranged at intervals, wherein each of the light-emitting devices comprises an anode, a light-emitting layer, and a cathode stacked in sequence away from the substrate;

a light-absorbing medium layer, disposed on a light-emitting side of the light-emitting device layer, arranged at least corresponding to the plurality of light-emitting areas, and disposed between the light-emitting layer and the cathode;

a light shielding layer, disposed on a side of the light-absorbing medium layer away from the light-emitting device layer, and provided with openings respectively corresponding to positions the plurality of light-emitting areas;

an organic protective layer, disposed on a side of the light shielding layer away from the substrate; and a plurality of diffuse reflection structures, disposed on a light emitting side of the light-emitting device layer and at least corresponding to the openings of the light shielding layer to perform a scattering treatment on ambient light, wherein the openings of the light shielding layer are filled with the organic protective layer, and the organic protective layer is a transparent material.

17. The display panel according to claim 16, wherein the plurality of diffuse reflection structures are distributed uniformly directly on a surface of the cathode.

18. The display panel according to claim 17, wherein the plurality of diffuse reflection structures are distributed uniformly directly on a surface of the cathode facing away from the light-emitting layer.

* * * * *